(12) United States Patent
Binninger et al.

(10) Patent No.: US 9,173,305 B2
(45) Date of Patent: Oct. 27, 2015

(54) METALLIZATION HAVING HIGH POWER COMPATIBILITY AND HIGH ELECTRICAL CONDUCTIVITY

(75) Inventors: Charles Binninger, Munich (DE); Ulrich Knauer, Munich (DE); Helmut Zottl, Munich (DE); Werner Ruile, Munich (DE); Tomasz Jewula, Markt Schwaben (DE); Rudolf Nuessl, Otzing (DE)

(73) Assignee: EPCOS AG, Munich (DE)

( * ) Notice: Subject to any disclaimer, the term of this patent is extended or adjusted under 35 U.S.C. 154(b) by 425 days.

(21) Appl. No.: 13/509,181

(22) PCT Filed: Dec. 1, 2010

(86) PCT No.: PCT/EP2010/068628
§ 371 (c)(1),
(2), (4) Date: Jul. 23, 2012

(87) PCT Pub. No.: WO2011/067281
PCT Pub. Date: Jun. 9, 2011

(65) Prior Publication Data
US 2012/0280595 A1   Nov. 8, 2012

(30) Foreign Application Priority Data
Dec. 2, 2009   (DE) .......... 10 2009 056 663

(51) Int. Cl.
*H03H 9/02* (2006.01)
*H05K 3/38* (2006.01)
(Continued)

(52) U.S. Cl.
CPC .......... *H05K 3/388* (2013.01); *H01L 23/49844* (2013.01); *H01L 23/49866* (2013.01); *H03H 9/02929* (2013.01); *H03H 9/14538* (2013.01); *H05K 1/09* (2013.01); *H01L 2924/0002* (2013.01); *H05K 1/0265* (2013.01);
(Continued)

(58) Field of Classification Search
CPC .......... H03H 9/02992; H03H 9/02535; H03H 9/02929
USPC ...... 310/313 R, 313 A, 313 B, 313 C, 313 D, 310/364
See application file for complete search history.

(56) References Cited

U.S. PATENT DOCUMENTS

| 5,134,460 A | 7/1992 | Brady et al. |
| 5,171,642 A | 12/1992 | DeHaven et al. |

(Continued)

FOREIGN PATENT DOCUMENTS

| DE | 37 87 772 T2 | 5/1994 |
| DE | 197 58 195 A1 | 7/1999 |

(Continued)

OTHER PUBLICATIONS

Daley, J., et al., "Aluminum Land Metallurgy with Copper on the Surface," IBM Technical Disclosure Bulletin, vol. 13, No. 6, Nov. 1970, XP-002620572, 1 page.
(Continued)

*Primary Examiner* — Derek Rosenau
(74) *Attorney, Agent, or Firm* — Slater & Matsil, L.L.P.

(57) ABSTRACT

A metallization can be used for components working with acoustic waves. The metallization includes a base having a bottom layer comprising titanium, and an upper layer comprising copper. A top layer of the metallization disposed on the base comprises aluminum.

17 Claims, 2 Drawing Sheets

(51) Int. Cl.
*H01L 23/498* (2006.01)
*H03H 9/145* (2006.01)
*H05K 1/09* (2006.01)
*H05K 1/02* (2006.01)
*H05K 1/03* (2006.01)
*H05K 3/04* (2006.01)

(52) U.S. Cl.
CPC ............. *H05K1/0306* (2013.01); *H05K 3/048* (2013.01); *H05K 2201/0338* (2013.01)

(56) References Cited

U.S. PATENT DOCUMENTS

| | | | |
|---|---|---|---|
| 6,316,860 | B1 | 11/2001 | Kimura et al. |
| 6,339,277 | B1* | 1/2002 | Iwamoto et al. ........... 310/313 R |
| 6,407,486 | B1 | 6/2002 | Kimura et al. |
| 7,026,743 | B2 | 4/2006 | Fujimoto et al. |
| 7,180,223 | B2 | 2/2007 | Ozaki et al. |
| 7,213,322 | B2 | 5/2007 | Nakagawara et al. |
| 7,605,524 | B2 | 10/2009 | Kamijo |
| 2002/0008437 | A1 | 1/2002 | Inoue et al. |
| 2002/0074904 | A1 | 6/2002 | Watanabe et al. |
| 2002/0113526 | A1* | 8/2002 | Nishihara ...................... 310/363 |
| 2004/0083590 | A1 | 5/2004 | Lee et al. |
| 2004/0086740 | A1* | 5/2004 | Fujimoto et al. .............. 428/597 |
| 2005/0205999 | A1 | 9/2005 | Forbes et al. |
| 2006/0175639 | A1 | 8/2006 | Leidl et al. |
| 2006/0273687 | A1* | 12/2006 | Fujimoto et al. .......... 310/313 R |
| 2007/0103038 | A1 | 5/2007 | Kamijo |
| 2007/0296306 | A1* | 12/2007 | Hauser et al. ............. 310/313 R |
| 2008/0222864 | A1 | 9/2008 | Lee et al. |
| 2009/0045704 | A1 | 2/2009 | Barber et al. |

FOREIGN PATENT DOCUMENTS

| | | |
|---|---|---|
| DE | 102 06 369 A1 | 8/2003 |
| DE | 102 36 003 A1 | 2/2004 |
| EP | 1 324 487 A2 | 7/2003 |
| EP | 1 786 099 A2 | 5/2007 |
| EP | 2 175 556 A1 | 4/2010 |
| JP | 6378591 A | 4/1988 |
| JP | 03-014308 A | 1/1991 |
| JP | 03-048511 A | 3/1991 |
| JP | 473994 A | 3/1992 |
| JP | 05-183373 A | 7/1993 |
| JP | 05-199062 A | 8/1993 |
| JP | 06-132777 A | 5/1994 |
| JP | 07-162255 A | 6/1995 |
| JP | 07-170145 A | 7/1995 |
| JP | 08-028272 A | 1/1996 |
| JP | 08-154030 A | 6/1996 |
| JP | 08-204483 A | 8/1996 |
| JP | 200226685 A | 1/2002 |
| JP | 2003-101372 A | 4/2003 |
| JP | 2003-258594 A | 9/2003 |
| JP | 2005253034 A | 9/2005 |
| JP | 2007134932 A | 5/2007 |
| WO | WO 99/16168 A1 | 4/1999 |
| WO | WO 00/74235 A1 | 12/2000 |

OTHER PUBLICATIONS

Darrow, D., et al., "Low-Cost Patterned Metallization Technique for High Density Multilayer Interconnect Applications," Proceedings of the 43rd Electronic Components & Technology Conference, Jun. 1-4, 1993, Orlando, Florida, 7 pages.

Dongmei, L., et al., "Enhancement of the orientation and adhesion of Al films on $LiNbO_3$ with Ni underlayer," Rare Metals, vol. 24, No. 4, Dec. 2005, pp. 363-369.

Gniewek, J., et al., "Titanium Overlay on Metallurgy," IBM Technical Disclosure Bulletin, vol. 13, No. 5, Oct. 1970, XP-00262573, 1 page.

Kamijo, A., et al., "A highly oriented Al[111] texture developed on ultrathin metal underlayers," Journal of Applied Physics, vol. 77, No. 8, Apr. 15, 1995, pp. 3799-3804.

Kimura, N., et al., "High Power-Durable and Low Loss Single-Crystalline Al/Ti Electrodes for RF SAW Devices," Proceedings of the 1998 IEEE Ultrasonics Symposium, vol. 1, pp. 315-318.

Matsukura, N., et al., "Power Durability of Highly Textured Al Electrode in Surface Acoustic Wave Devices," Japanese Journal of Applied Physics, vol. 35, May 1996, pp. 2983-2986.

Nakagawara, O., et al., "High Power Durable SAW Filter with Epitaxial Aluminum Electrodes on 38.5 Rotated Y-X $LiTaO_3$ by Two-Step Process Sequence in Titanium Intermediate Layer," Proceedings of the 2003 IEEE Ultrasonics Symposium, pp. 1734-1736.

Nakagawara, O., et al., "High Power Durable SAW Antenna Duplexers for W-CDMA with Epitaxially Grown Aluminum Electrodes," Proceedings of the 2002 IEEE Ultrasonics Symposium, pp. 43-46.

Ota, Y., et al., "Ti-Added Al Electrodes on $LiTaO_3$ 36° Y-X Substrates for High Power Surface Acoustic Wave Devices I," Japanese Journal of Applied Physics, vol. 32, Part 1, No. 5B, May 1993, pp. 2351-2354.

Sakurai, A., et al., "Epitaxially Grown Al Electrodes for High-Power Surface Acoustic Wave Devices," Japanese Journal of Applied Physics, vol. 31, Part 1, No. 9B. Sep. 1992, pp. 3064-3066.

Tanski, W., "Surface Acoustic Wave Resonators on Quartz," IEEE Transactions on Sonics and Ultrasonics, vol. SU-26, No. 2, Mar. 1979, pp. 93-104.

Wikipedia, "Lift-off (microtechnology)," downloaded from http://en.wikipedia.org/wiki/Lift-off (microtechnology), 2 pages.

* cited by examiner

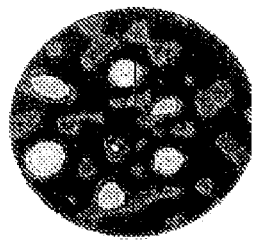 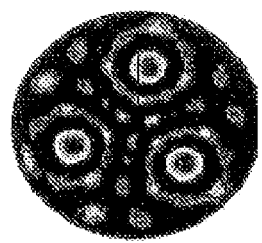
Fig. 3aFig. 3b

METALLIZATION HAVING HIGH POWER COMPATIBILITY AND HIGH ELECTRICAL CONDUCTIVITY

This patent application is a national phase filing under section 371 of PCT/EP2010/068628, filed Dec. 1, 2010, which claims the priority of German patent application 10 2009 056 663.5, filed Dec. 2, 2009, each of which is incorporated herein by reference in its entirety.

TECHNICAL FIELD

The invention relates to metallizations having high power durability and high electrical conductivity for current-carrying structures, and to methods for producing them. The invention relates, in particular, to metallizations for current-carrying structures for components operating with acoustic waves.

BACKGROUND

Metallizations for components operating with acoustic waves, from which, by way of example, busbars, electrode fingers connected to the busbars or reflector structures are formed on a piezoelectric substrate, should preferably be designed to have particularly high power durability.

Bulk acoustic waves (BAW) or surface acoustic waves (SAW) propagate within a solid or at the surface thereof; their frequencies are in the GHz range.

The current-carrying (electrode) structures, which convert electrical radiofrequency signals into acoustic waves or conversely acoustic waves into electrical radiofrequency signals, therefore have to withstand firstly the electric currents and secondly the mechanical deformation as a result of the acoustic waves, without incurring damage.

U.S. Pat. No. 7,605,524 B2 discloses electrode structures for components operating with surface acoustic waves (SAW). In one embodiment, an electrode structure is arranged on monocrystalline lithium tantalate or lithium niobate. The electrode structure comprises a first layer composed of titanium. A second layer deposited thereon comprises aluminum. The second layer comprises two <1 1 1> domains. Methods for producing the electrode layers concern the epitaxial growth of the layer comprising aluminum. A highly textured layer comprising aluminum has good, i.e., high, electrical conductivity values and a high power durability.

The growth of a layer deposited on a substrate is called epitaxial if the alignment of the atoms of the layer is oriented to the alignment of the atoms of the substrate. One general problem in the case of epitaxial growth consists in providing a suitable surface. This is because the constitution of the surface of the substrate—as interface between substrate and layer—crucially influences the order of the atoms of the deposited layer. Therefore, substrates are usually pretreated by heat treatment or by incipient etching. Between the pretreatment and the actual deposition process, the surface of the substrate must no longer be contaminated with impurities.

The use of the lift-off technique when depositing electrode structures onto substrates is problematic if a particularly "clean" substrate surface is of importance. This is because, in the first step, a resist layer is applied to the possibly pretreated substrate surface. In further method steps, said resist layer is then partly exposed and the exposed regions are removed in a further process step. At the formerly exposed locations, the substrate surface is now uncovered again. However, this surface in the meantime has had contact both with the resist layer and with the solvent that removed the exposed resist layer. The substrate surface is therefore contaminated.

Epitaxial growth of electrode layers by means of the lift-off technique appeared hitherto to be possible only with great difficulty.

Another method, the so-called etching method, is based on the electrode material being applied to the possibly pretreated substrate surface over a large area and the electrode structures being obtained by etching away the undesirable covering regions of the electrode material: superfluous electrode material is removed.

SUMMARY

In one aspect, the present invention specifies a metallization for current-carrying structures which has high power durability, has a high electrical conductivity and is compatible both with etching methods and with lift-off methods.

The invention specifies a metallization for current-carrying structures which can find application in electrical components, wherein the metallization is arranged on a substrate. The metallization comprises a base and a top layer arranged thereon. The base comprises a bottom layer, which is arranged above or directly on the substrate surface. The bottom layer comprises titanium or a titanium compound as the main constituent. The base furthermore comprises an upper layer, which is arranged above or directly on the bottom layer and comprises copper as the main constituent. The top layer is arranged directly on the upper layer and comprises aluminum as the main constituent.

The inventors have found that—contrary to the general opinion—highly textured current-carrying structures can be grown on a substrate and patterned by means of a lift-off method in the process. A highly textured electrode structure grown and patterned in this way has a very high electrical conductivity and a high mechanical power durability. It is particularly advantageous that such an electrode structure can be patterned both by means of etching methods and by means of lift-off methods. The possible contamination of the substrate during the lift-off method therefore does not impede the formation of a highly textured layer. Such electrode structures can therefore be produced with high quality and with high reproducibility in a simple manner.

The out-of-plane texture of an electrode produced in this way or the top layer thereof can be a <1 1 1> texture. Such a texture is distinguished by the fact that its <1 1 1> direction—that is to say the space diagonal of the face centered cubic unit cell—coincides with the normal to the surface of the substrate. The in-plane texture is also aligned according to the texture predetermined by the substrate surface.

The base primarily serves to make available to the top layer a defined surface, i.e., a surface atomically formed as uniformly as possible, on which the top layer can then grow—as far as possible epitaxially. The top layer in turn is provided for primarily carrying electric currents.

In one embodiment, the base comprises a middle layer, which is arranged between the bottom layer and the upper layer. The middle layer comprises an element which is nobler than aluminum, i.e. has a higher standard electrode potential (normalized to hydrogen).

In one embodiment, the bottom layer of the base is thinner than the upper layer of the base. A titanium layer is a possibility for the bottom layer. A titanium layer or a layer comprising titanium is preferably thicker than approximately 2 nm and thinner than approximately 20 nm. If the bottom layer is too thin, there is the risk of the effect of good texturing being omitted. An excessively thick bottom layer leads to increased roughness and likewise to a worsened texture.

In one embodiment, the upper layer is thinner than the top layer. One task of the upper layer can be seen in communicating the "surface information" to the top layer. Therefore, a relatively thin upper layer is preferred. The electric current is carried substantially by the top layer, which therefore also preferably has a lower electrical resistance than the base. Nevertheless, each individual layer of the base can have a higher conductivity than the top layer. The top layer then has the lower resistance on account of its thickness. Depending on the current to be carried and, in the case of components operating with acoustic waves, depending on the desired mass per unit area, a relatively thick top layer is advantageous. An advantageous top layer, e.g., composed of Cu, is between 1 and 30 nm thick. Without an upper layer comprising Cu, a highly textured layer comprising Al also does not have sufficient power durability.

In a further embodiment, the middle layer is thinner than the bottom layer or thinner than the upper layer. Consequently, the material costs for the middle layer, which can comprise expensive Ag, are reduced; the deposition duration is shortened. Despite a relatively thin middle layer, a good texture is obtained. A preferred thickness—for an optimum texture—of the middle layer, e.g., of a middle layer comprised of Ag, is between 0.5 nm and 10 nm.

In a further embodiment, the bottom layer comprises nitrogen atoms. TiN, in particular, is provided as the material of the bottom layer.

In one embodiment, the middle layer comprises gold, silver, platinum or palladium.

In one embodiment, the middle layer consists of silver. Such a metallization therefore comprises a base composed of a bottom layer comprising titanium or a titanium compound as main constituent, composed of an upper layer comprising the main constituent copper, and composed of a middle layer comprising silver. In this case, the middle layer is arranged between the bottom layer and the upper layer. A metallization whose top layer is arranged on a base of this type has a particularly high power durability.

In one embodiment, the top layer has a <1 1 1> texture. In this case, the <1 1 1> direction is the direction of the space diagonal of the unit cell of the top layer. This direction corresponds to the direction of the normal to the surface of the substrate. Aluminum is generally present in the so-called hexagonal close-packed (hcp) form. This corresponds to a face centered cubic space lattice. In this case, the <1 1 1> direction runs perpendicularly through layers of aluminum atoms that are as close-packed as possible. These layers—perpendicular to the <1 1 1> direction—form a hexagonal network. A metallization according to the invention therefore has not only an in-plane texture (the atoms of the electrode are aligned in the directions parallel to the substrate surface) but also an out-of-plane texture (the atoms of the electrode are aligned in a normal direction with respect to the substrate surface).

In one embodiment, the top layer of the metallization has a twin texture or a single texture. As already mentioned above, the atoms of the top layer are aligned in hexagonally arranged atomic layers. A single texture has a higher degree of order than a twin texture. The twin texture differs from the single texture in that two of the appropriate alignments of different atomic layers with respect to one another are realized. In the case of the single texture, a predetermined relative alignment of adjacent atomic layers with respect to one another is maintained by all layers.

In one embodiment, a piezoelectric layer is arranged between the substrate and the bottom layer of the metallization. In an alternative embodiment, the substrate itself is piezoelectric. Such a substrate or the piezoelectric layer can comprise lithium tantalate or lithium niobate, for example.

In components operating with acoustic waves, electrode structures, by virtue of the piezoelectric effect, convert electrical radiofrequency signals into acoustic waves and conversely acoustic waves into electrical radiofrequency signals. On account of the double loading (one mechanical and one electrical) mentioned in the introduction, a metallization according to the invention with its high power durability is particularly suitable in a component operating with acoustic waves and is provided for use in a component operating with acoustic waves.

One such component can be a component operating with bulk acoustic waves. In an alternative embodiment, however, a metallization according to the invention is used in a component operating with surface acoustic waves. In particular, the use of the metallization in a duplexer operating with surface acoustic waves is possible.

A method according to the invention for producing a metallization of this type comprises the steps of providing a substrate, and applying the metallization using a lift-off technique.

Since it has been found that a metallization according to the invention has a high power durability and a good electrical conductivity even if it has been applied to a substrate by means of a lift-off technique, more freedoms are now opened up in the production of components with corresponding metallization.

In particular, a method for producing a metallization according to the invention can comprise the steps of
cleaning the substrate surface,
applying photoresist to the substrate surface,
patterning the photoresist,
applying the metallization to the uncovered surfaces of substrate and photoresist, and
lifting-off the photoresist together with regions of metallization applied directly thereabove.

In this case, the patterning of the photoresist can constitute producing a so-called negative structure.

BRIEF DESCRIPTION OF THE DRAWINGS

The invention is explained in greater detail below on the basis of exemplary embodiments and associated schematic figures, in which:

FIG. 3a shows a microscope micrograph of the in-plane texturing of a conventional metallization arranged onto a substrate by means of a lift-off technique, and FIG. 3b shows a microscope micrograph of the in-plane texturing of a metallization according to the invention which was applied to a substrate using a lift-off technique.

DETAILED DESCRIPTION OF ILLUSTRATIVE EMBODIMENTS

Figure 1:
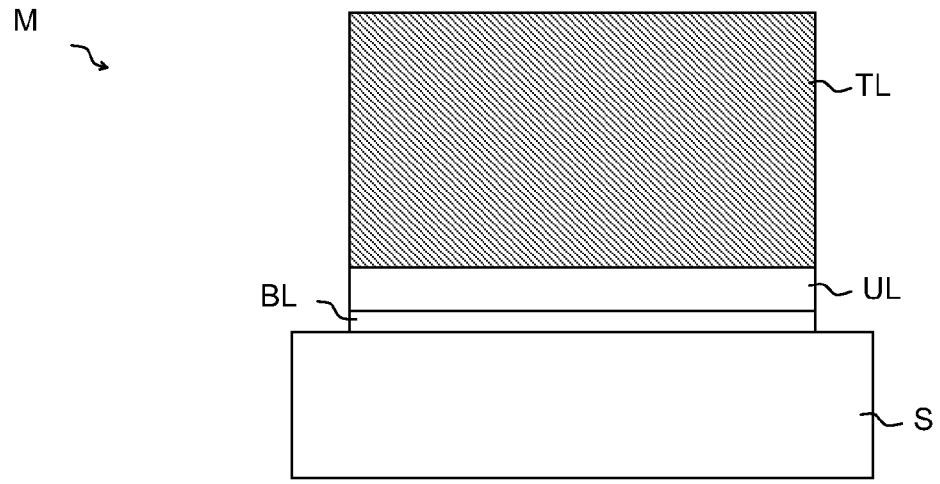
FIG. 1 shows a cross section through a patterned metallization arranged on a substrate.

FIG. 1 shows the cross section of a metallization M comprising a top layer TL, which is arranged on a base. The base comprises an upper layer UL and a bottom layer BL. The base composed of upper layer UL and bottom layer BL is arranged on the surface of a substrate S. The metallization, consisting of top layer TL and base UL, BL can constitute, for example, the metallization for the electrode fingers of a SAW component. FIG. 1 then shows the cross section through such an electrode finger.

Figure 2:
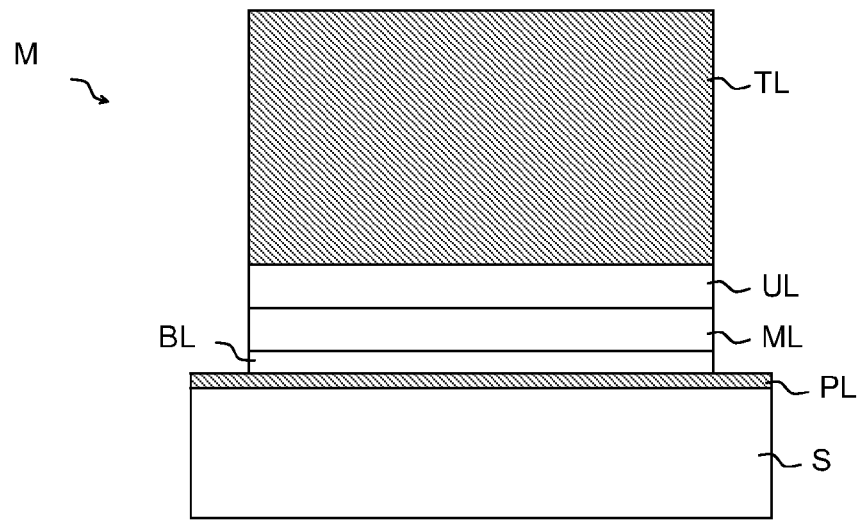
FIG. 2 shows a cross section through a patterned metallization arranged on a substrate, said metallization being arranged on a piezoelectric layer on the substrate surface.

FIG. 2 shows a cross section through a further embodiment of the metallization M. The metallization M comprises a top layer TL on a base. The base is formed by an upper layer UL, a bottom layer BL and, as a further part, by a middle layer ML. A piezoelectric layer PL is arranged between the substrate S and the bottom layer BL of the metallization M.

If the metallization M is used in a component operating with acoustic waves, then corresponding electrodes formed from the metallization convert electrical radiofrequency signals into acoustic waves (BAW or SAW) or conversely acoustic waves into electrical radiofrequency signals.

Surface acoustic waves propagate at the surface of a substrate. In order that surface acoustic waves can be induced at the surface of the substrate, the substrate has to interact with the electric field distribution between electrode fingers of different polarities. If the substrate is piezoelectric, then the alternating electric radiofrequency fields can directly excite surface acoustic waves in the substrate. If the substrate is not piezoelectric, then at least one piezoelectric layer PL is required on the surface of the substrate S between substrate S and metallization M.

FIG. 3a shows a microscope micrograph of an electrode surface which is not patterned or is at best hardly patterned and which was arranged on a substrate and patterned by means of a lift-off method. In contrast thereto, FIG. 3b shows a microscope micrograph of a highly textured metallization according to the invention, which was likewise produced on a substrate by means of lift-off methods. The trigonal symmetry of the texturing corresponding to a hexagonal network is clearly discernible.

A metallization according to the invention is not restricted to one of the exemplary embodiments described. Variations which, by way of example, comprise even further layers or whose layers comprise even further elements likewise constitute exemplary embodiments according to the invention.

The invention claimed is:

1. A metallization for carrying current in an electrical component, the metallization comprising:
   a bottom layer overlying a substrate surface and comprising Ti or a titanium compound as main constituent;
   an upper layer overlying the bottom layer and comprising Cu as main constituent, wherein the bottom layer and the upper layer form a base layer; and
   a top layer in direct contact with the upper layer and comprising Al as main constituent, wherein the top layer has a <1 1 1> texture, wherein in the base layer further comprises a middle layer that is arranged between the bottom layer and the upper layer, the middle layer comprising an element that is nobler than Al, wherein the middle layer consists of Ag.

2. The metallization according to claim 1, wherein the bottom layer is thinner than the upper layer.

3. The metallization according to claim 1, wherein the upper layer is thinner than the top layer.

4. The metallization according to claim 1, wherein the middle layer is thinner than the bottom layer or thinner than the upper layer.

5. The metallization according to claim 1, wherein the bottom layer has a thickness of between 2 nm and 20 nm, the middle layer has a thickness of between 0.5 nm and 10 nm, and the upper layer has a thickness of between 1 nm and 30 nm.

6. The metallization according to claim 1, wherein the bottom layer comprises TiN.

7. The metallization according to claim 1, wherein the middle layer comprises Ag, Au, Pt or Pd.

8. The metallization according to claim 1, wherein Al is the main constituent of the top layer, and the top layer comprises Cu, Mg, an Al—Cu alloy, an Al—Mg alloy or an Al—Cu—Mg alloy.

9. The metallization according to claim 1, wherein the top layer has a twin texture or a single texture.

10. The metallization according to claim 1, further comprising a piezoelectric layer arranged between the substrate and the bottom layer.

11. The metallization according to claim 10, wherein the piezoelectric layer comprises $LiTaO_3$ or $LiNbO_3$.

12. The metallization according to claim 1, wherein the substrate is piezoelectric.

13. The metallization according to claim 12, wherein the substrate comprises $LiTaO_3$ or $LiNbO_3$.

14. A component comprising:
    a piezoelectric layer;
    a bottom layer overlying the piezoelectric layer and comprising Ti or a titanium compound as main constituent;
    an upper layer overlying the bottom layer and comprising Cu as main constituent, wherein the bottom layer and the upper layer form a base layer; and
    a top layer in direct contact with the upper layer and comprising Al as main constituent, wherein the top layer has a <1 1 1> texture, wherein in the base layer further comprises a middle layer that is arranged between the bottom layer and the upper layer, the middle layer comprising an element that is nobler than Al. wherein the middle layer consists of Ag;
    wherein the component is configured to operate with acoustic waves.

15. The component according to claim 14, wherein the component is configured to operate with surface acoustic waves.

16. The component according to claim 15, wherein the component comprises a duplexer operating with surface acoustic waves.

17. A metallization for carrying current in an electrical component, the metallization comprising:
    a bottom layer overlying a substrate surface and comprising Ti or a titanium compound as main constituent;
    an upper layer overlying the bottom layer and comprising Cu as main constituent, wherein the bottom layer and the upper layer form a base layer;
    a middle layer disposed between the bottom layer and the upper layer, wherein the middle layer consists of Ag; and
    a top layer in direct contact with the upper layer and comprising Al as main constituent.

* * * * *

UNITED STATES PATENT AND TRADEMARK OFFICE
CERTIFICATE OF CORRECTION

| | | |
|---|---|---|
| PATENT NO. | : 9,173,305 B2 | Page 1 of 1 |
| APPLICATION NO. | : 13/509181 | |
| DATED | : October 27, 2015 | |
| INVENTOR(S) | : Charles Binninger | |

It is certified that error appears in the above-identified patent and that said Letters Patent is hereby corrected as shown below:

Claims

In Col. 6, line 16, claim 9, delete "a twin texture or".

Signed and Sealed this
Twenty-second Day of March, 2016

Michelle K. Lee
*Director of the United States Patent and Trademark Office*